United States Patent
Nishigaki

(10) Patent No.: US 7,470,610 B2
(45) Date of Patent: Dec. 30, 2008

(54) METHOD OF FABRICATING ORGANIC ELECTROLUMINESCENT DEVICES

(75) Inventor: Kenji Nishigaki, Aichi-ken (JP)

(73) Assignee: Kabushiki Kaisha Toyota Jidoshokki, Kariya-Shi (JP)

( * ) Notice: Subject to any disclaimer, the term of this patent is extended or adjusted under 35 U.S.C. 154(b) by 137 days.

(21) Appl. No.: 11/517,726

(22) Filed: Sep. 7, 2006

(65) Prior Publication Data
US 2007/0054430 A1 Mar. 8, 2007

(30) Foreign Application Priority Data
Sep. 7, 2005 (JP) ............... 2005-259550

(51) Int. Cl.
*H01L 21/4763* (2006.01)
(52) U.S. Cl. .............. 438/623; 438/82; 438/99; 438/725; 438/780
(58) Field of Classification Search .......... 438/82, 438/99, 623, 725, 780, FOR. 135
See application file for complete search history.

(56) References Cited

U.S. PATENT DOCUMENTS

| | | | |
|---|---|---|---|
| 5,953,585 A | 9/1999 | Miyaguchi | ............... 438/35 |
| 6,563,261 B1 | 5/2003 | Nakayama et al. | |
| 2004/0079948 A1 | 4/2004 | Chen et al. | |
| 2005/0059179 A1 | 3/2005 | Erchak et al. | |
| 2005/0260804 A1 | 11/2005 | Kang et al. | |
| 2006/0008931 A1* | 1/2006 | Lee et al. | ............... 438/30 |

FOREIGN PATENT DOCUMENTS

| | | |
|---|---|---|
| EP | 63-228790 | 9/1988 |
| EP | 0 459 469 A1 | 12/1991 |
| JP | 2000-113981 | 4/2000 |
| JP | 2004-014236 | 1/2004 |

OTHER PUBLICATIONS

European Search Report dated Jul. 20, 2007 issued by European Patent Office for application No. 06120173.7-2111.

* cited by examiner

*Primary Examiner*—N Drew Richards
*Assistant Examiner*—Joannie A Garcia
(74) *Attorney, Agent, or Firm*—Morgan & Finnegan, LLP

(57) ABSTRACT

A method of fabricating an organic EL device by which sealing films can be patterned, without using any wet process. The method has the steps of:
  preparing a substrate 1 on which a first electrode 2 has been formed and forming a laminated film 7 by laminating an organic layer 3 comprising a luminescent layer and a second electrode 4 on the first electrode 2 in this order;
  forming a first sealing film 5 which covers the whole region of the laminated film 7;
  forming on the surface of the first sealing film 5 a second sealing film 6 having an opening pattern; and
  patterning the first sealing film 5 by dry-etching the first sealing film 5 using the second sealing film 6 having the opening pattern as a mask.

7 Claims, 1 Drawing Sheet

METHOD OF FABRICATING ORGANIC ELECTROLUMINESCENT DEVICES

FIELD OF THE INVENTION

The present invention concerns a method of fabricating organic electroluminescent devices.

BACKGROUND OF THE INVENTION

On the surface of organic electroluminescent devices, hereinafter denoted as EL devices which have been formed by sequential lamination of an anode, an organic layer, and a cathode on a substrate, a sealing film is normally provided in order to prevent deterioration of the organic layer and the electrodes from oxygen, humidity, etc., in the atmosphere.

On the other hand, in order to supply direct voltage for organic EL devices, it is necessary to expose the terminal electrode portion of each electrode of the organic EL devices so that they can be connected with wires from an external driving electric power source. That is, each constituent layer of the organic EL devices, for example, a sealing film must be patterned to expose the terminal electrode portion.

In JP 2000-113 981 A, a technique is disclosed wherein on a protective film of organic EL devices sequentially formed of a first electrode, an organic film, a second electrode material film, and the protective film on a transparent substrate, a desired shape of a resist pattern is formed which is used as a mask to dry-etch and pattern the protective film, the second electrode material film, and the organic film.

In the method as described in JP 2000-113 981 A, however, the resist must be deposited, exposed, developed, removed, etc. So, there is a problem that the process of fabricating organic EL devices is complex. In addition, upon patterning the resist provided on the protective film into a desired shape, a developing solution is used. So, this wet process may damage the organic film.

SUMMARY OF THE INVENTION

After considering the above, the present invention has been conceived of and its object is to provide a method of fabricating organic EL devices wherein the sealing film can be patterned without using such a wet process.

After industriously conducting research and development in order to solve the above problem, the present inventors have conceived that it is effective to form a first sealing film over a first electrode, an organic layer comprising a luminescent layer, and a second electrode laminated and formed on a substrate, to then form on the surface of the first sealing film a second sealing film having an opening pattern, and to pattern the first sealing film by dry-etching the first sealing film using the second sealing film as a mask to complete the present invention.

A method of fabricating an organic EL device of the present invention comprises the following steps:

(1) preparing a substrate on which a first electrode has been formed and forming a laminated film by laminating an organic layer comprising a luminescent layer and a second electrode on the first electrode in this order;

(2) forming a first sealing film which covers the whole region of the laminated film;

(3) forming on the surface of the first sealing film a second sealing film having an opening pattern; and (4) patterning the first sealing film by dry-etching the first sealing film using the second sealing film having an opening pattern as a mask.

It is preferred that the first sealing film and the second sealing film are formed of different materials and the first sealing film is patterned utilizing the etching speed gap by the difference between the sealing film materials of the first sealing film and the second sealing film.

It is preferred that the first sealing film and the second sealing film are formed of different film thicknesses and the first sealing film is patterned utilizing the difference between the film thicknesses of the first sealing film and the second sealing film.

In step (1) the laminated film may be formed to provide a luminescent portion and a terminal electrode portion, in step (2) the first sealing film may be formed over the whole region of the laminated film including the luminescent portion and the terminal electrode portion, in step (3) the second sealing film may be formed in which a portion corresponding to the terminal electrode portion is an opening, and in step (4) the terminal electrode portion may be exposed by removal of the first sealing film on the terminal electrode portion.

Further, it is preferred that in step (3) masking tape is adhered onto the surface of the first sealing film to form a mask pattern, the second sealing film is formed on the surface of the first sealing film on which the mask pattern has been formed, and the second sealing film having an opening pattern is formed by removal of the masking tape.

It is desirable that the first sealing film is made of silicon nitride and the second sealing film is made of silicon oxide.

The first sealing film may comprise multiple layers.

It is preferred that in step (4) the dry-etching uses $NF_3$ as an etching gas.

According to the present invention, a method of fabricating organic EL devices can be provided wherein a sealing film can be patterned without using a wet process.

DESCRIPTION OF THE PREFERRED EMBODIMENTS

Figure 1:
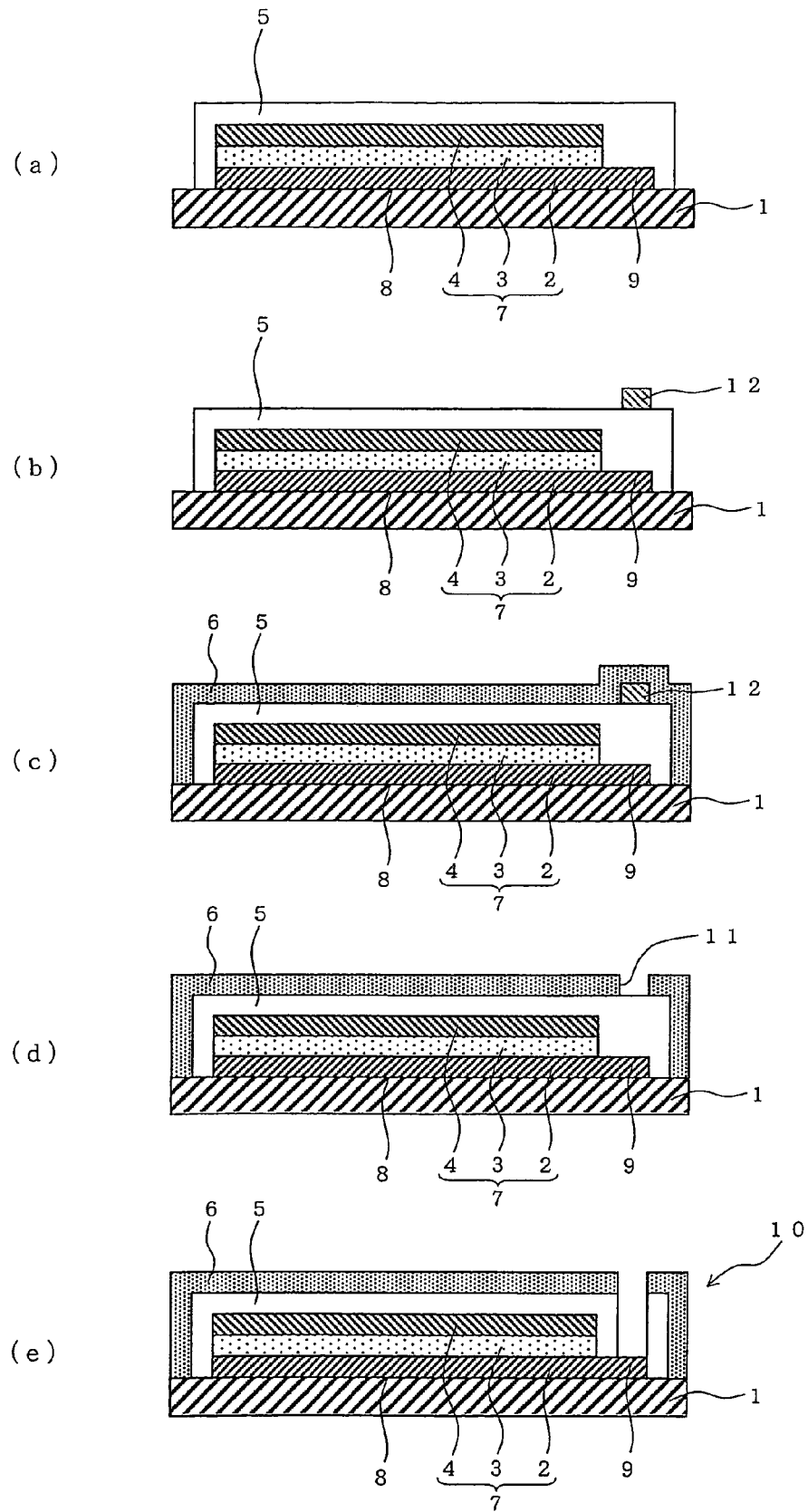
FIG. 1 is a partially sectional view illustrating one embodiment for fabricating the organic EL device according to the present invention.

An embodiment of the present invention will be set forth with reference to the appended drawing. FIG. 1 is a partially sectional view illustrating one embodiment of the organic EL device fabricated according to the present invention.

In FIG. 1 (e), an organic EL device 10 has a first electrode 2 formed on a substrate 1, an organic layer 3 comprising a luminescent layer formed on the first electrode 2, and a second electrode 4 formed on the organic layer 3. A first sealing film 5 is formed so as to cover the whole surface of the first electrode 2, the organic layer 3 comprising a luminescent layer, and the second electrode 4. A second sealing film 6 is formed so as to cover only the desired portion of the surface of the first sealing film.

First, in step (1) of this embodiment, the substrate 1 is prepared on which the first electrode 2 has been formed. The organic layer 3 comprising a luminescent layer and the second electrode 4 are sequentially laminated on the first electrode 2 to form a laminated film 7. In this embodiment, the first electrode 2 constitutes the anode and the second electrode 4 constitutes the cathode. At the same time, the laminated film 7 includes a luminescent portion 8 and a terminal electrode portion 9. The "terminal electrode portion 9" herein is a portion to be connected with wires from an external electric power source to supply direct voltage for the first electrode 2 and the second electrode 4.

The substrate 1 is a plate to support the organic EL device 10. When the light-emitting direction is to the substrate 1, for example, a transparent substrate such as a glass substrate, acryl resin substrate, etc., is used which exhibits high transparency to emitted light. When the light-emitting direction is to the side opposite the substrate 1, in addition to the above transparent substrates, a non-transparent substrate such as a silicon substrate, metal substrate, etc., can be used.

For the first electrode 2, known electrode materials are used. When the light-emitting direction is to the substrate 1, for example, transparent electrode materials such as indium tin oxide (ITO), indium zinc oxide (IZO), zinc oxide (ZnO), etc., can be used.

For the second electrode 4, known electrode materials are used. When the light-emitting direction is to the substrate 1, metals, alloys, etc., can be used. For example, Ag, Al, etc., can be used.

When the light-emitting direction is to the side opposite the substrate 1, metals, alloys, etc., are used for the first electrode 2 and the above transparent electrode materials are used for the second electrode 4, inversely.

The organic layer 3 comprising a luminescent layer, provided between the above first electrode 2 and the above second electrode 4 may for example be composed of a luminescent layer alone or may be composed of a combination of a luminescent layer with one or more layers such as a hole-injecting layer, a hole-transporting layer, an electron-injecting layer, an electron-transporting layer, a hole-blocking layer, a buffering layer, etc. For the luminescent layer, known luminescent materials such as Alq3, etc., can be used. A Luminescent layer which has a construction to emit monochromatic light such as of red, green, blue, yellow, etc., combinations thereof, for example, white can be used.

The laminated film 7 may be formed by a known suitable method. More concretely, on the substrate 1 on which the first electrode has been formed, the organic layer 3 comprising a luminescent layer, the second electrode 4, and other required layers are laminated by methods such as sputtering, spin-coating, CVD, vacuum-vapor-deposition, etc.

Step (2), as shown in FIG. 1 (*a*), is a step to form the first sealing film 5 covering the whole region of the laminated film 7 formed in step (1) to be protected from oxygen, water (humidity), etc.

For the first sealing film 5, known sealing film materials are used. For example, silicon nitride, silicon oxide, silicon nitride oxide, silicon carbide, etc., are used, silicon nitride being preferabe. The first sealing film 5 made of such sealing film materials can protect the laminated film 7 from oxygen, water (humidity), etc., and prevent the performance of the organic EL device 10 from being deteriorated by oxygen, water (humidity), etc.

The first sealing film 5 may, for example, be a single layer film of silicon nitride or may be a double layer film of silicon nitride and silicon oxide or may be a multiple layer film of laminated silicon nitride, silicon oxide, silicon nitride oxide, silicon carbide, etc.

The first sealing film 5 is formed by known thin film forming methods such as CVD to cover the whole region of the laminated film 7 formed in step (1).

Step (3), as shown in FIG. 1 (*b*)-(*d*), is a step to form the second sealing film 6 having an opening 11 of a certain pattern on the surface of the first sealing film 5 formed in step (2).

For the second sealing film 6, known sealing film materials are used such as silicon nitride, silicon oxide, silicon nitride oxide, silicon carbide, etc., preferably silicon oxide.

In a method of forming the second sealing film 6 with the opening 11 of the certain pattern in step (3), for example as shown in FIG. 1 (*b*), a mask pattern 12 is formed by adhering the masking tape on the surface of the first sealing film 5. As shown in FIG. 1 (*c*), the second sealing film 6 will be formed on the surface of the first sealing film 5 on which the mask pattern 12 has been formed. Subsequently, as shown in FIG. 1 (*d*), the second sealing film 6 with the opening 11 of the certain pattern is formed by removal of the masking tape. Concretely, on the surface of the first sealing film 5 on which the mask pattern 12 has been formed by the masking tape, polysilazane, which is the material for the second sealing film 6, is deposited and cured to be a silicon oxide film and the masking tape is removed. This gives the second sealing film 6 wherein the opening 11 is formed corresponding to the portions the mask pattern 12 covered, that is, where the masking tape adhered to. The second sealing film 6 may be formed by printing methods.

When using the masking tape as noted above, it is adhered onto the surface of the first sealing film 5 for the second sealing film 6 to have the opening 11 of the certain pattern. The opening 11 provided on the second sealing film 6 corresponds to the portions of the first sealing film 5 to be removed by dry-etching in step (4) noted below. For example, when the mask pattern 12 is formed corresponding to the terminal electrode portion 9 of the laminated film 7 on the first sealing film 5 and the second sealing film 6 is formed according to this mask pattern 12, the second sealing film 6 is formed wherein the portions corresponding to the terminal electrode portion 9 of the laminated film 7 are the opening 11.

Step (4), as shown in FIG. 1 (*e*), is a step to dry-etch using as a mask the second sealing film 6 with the opening 11 of the certain pattern patterning the first sealing film 5. In step (4), the portions of the first sealing film 5 corresponding to the opening 11 of the second sealing film 6 are removed. For the dry-etching, known etching methods are used such as reactive ion-etching, sputter-etching, ion beam-etching, plasma-etching, etc. Preferably, reactive ion-etching is used. Since these are anisotropic etchings, influence by side etching can be reduced and the first sealing film 5 can be patterned so accurately according to the opening 11 provided it is on the second sealing film 6.

As the etching gase, gases reactive with the first sealing film 5 are used such as $NF_3$, $COF_2$, $C_3F_8$, halogenated hydrocarbons, etc.

By the dry-etching in step (4), the first sealing film 5 formed in step (2) is dry-etched according to the pattern on the second sealing film 6 formed in step (3). When in step (3) the second sealing film 6 is patterned for the opening 11 of the second sealing film 6 to correspond to the terminal electrode portion 9 of the laminated film 7, in step (4) the first sealing film 5 is partially removed on the terminal electrode portion 9.

In general, when the same etching gas is used to etch different materials, they have a different etching speed. Thus, the first sealing film 5 and the second sealing film 6 may be made of different materials. Utilizing the difference in the etching speeds arising from the difference in the sealing film materials, the first sealing film 5 may be patterned. In this method, even when the first sealing film 5 and the second sealing film 6 have the same film thickness, the patterning utilizing the difference in the etching speeds is possible.

Such cases include for example a case where the material for the first sealing film 5 is silicon nitride and the material for the second sealing film 6 is silicon oxide.

Materials which can be used for the sealing films are silicon nitride, silicon oxide, silicon carbide, etc. For example, the reactivity of these sealing film materials with $NF_3$ gas, that is, the etching speed is decreased in the order of:

silicon carbide>silicon nitride>silicon oxide.

So, if the first and second sealing films 5 and 6 are made of silicon nitride and silicon oxide, respectively, and are dry-etched using $NF_3$ gas as the etching gas, the first sealing film 5 can be etched using as a mask the second sealing film 6.

Further, the reactivity of silicon oxide with fluoride gases such as $NF_3$ gas, etc., is:

$SiO_a$>$SiO_b$(a<b).

Hence, the material for the first sealing film 5 may be $SiO_a$, the material for the second sealing film 6 may be $SiO_b$ (a<b), and $NF_3$ gas may be used as the etching gas for dry-etching these materials.

If the first sealing film 5 and the second sealing film 6 are formed with different film thicknesses, even when the first sealing film 5 and the second sealing film 6 are made of the same material, the first sealing film 5 can be patterned utilizing the difference in the film thicknesses.

For patterning the first sealing film 5 by dry-etching using the second sealing film 6 as a mask, the above difference in the etching speeds arising from the difference in the sealing film materials and the above difference in the film thicknesses may be combined and utilized. Also by adjusting the dry-etching conditions, the etching speeds of the first sealing film 5 and the second sealing film 6 can be controlled.

As noted above, only the portion of the first sealing film 5 corresponding to the terminal electrode portion 9 of the laminated film 7 is completely removed by dry-etching and the other portions of the laminated film 7 are completely covered by the first sealing film 5 and the second sealing film 6 to finally fabricate the organic EL device 10.

In conclusion, according to the present embodiments, the whole region of the laminated film 7 consisting of the first electrode 2, the organic layer 3 comprising a luminescent layer, and the second electrode 4 is once covered by the first sealing film 5, the second sealing film 6 is further formed with the opening 11 of the certain pattern for example using the masking tape, and dry-etching is done using the second sealing film 6 as a mask. So, it is possible to accurately expose the desired portions of the organic EL device 10 to be fabricated. Such high accuracy can be achieved with the need to consider only the accuracy of forming the opening 11 of the certain pattern of the second sealing film 6 in step (3), for example, the errors in positioning the masking tape (errors upon positioning), etc.

By the above method, the first sealing film 5 is patterned utilizing the second sealing film 6 as a mask, resulting in simpler fabrication processes and higher productivity for organic EL devices having a sealing film.

In the present embodiment, dry-etching is done using as a mask the second sealing film 6 formed with the opening 11 of the certain pattern, so, as it is not done via any wet process such as in so-called "resist methods", the organic EL devices 10 can be fabricated without being affected by humidity, etc. Thus, the organic EL devices 10 can be fabricated with a variety of good properties.

Compared to "resist methods" which require many steps such as resist-depositing, light exposure, developing, resist-removing, etc., the present embodiments require fewer steps, which means a very simple method. Fewer steps mean not only the method is simple but also that there are fewer errors in patterning accuracy.

In the present embodiment, for example, the terminal electrode portion 9 of the organic EL device 10 to be fabricated can be accurately exposed. Inversely, the portions to be sealed of the organic EL device 10 can be uniformly sealed by a plurality of sealing films.

In addition, according to the present method, when a plurality of organic EL devices 10 having the first sealing film 5 provided are formed on one substrate 1, more organic EL devices 10 can be formed. That is, using as a substrate one large substrate 1 (mother glass) on which a first electrode 2 has been formed, a plurality of independent laminated films 7 are formed on the mother glass, each of the laminated films 7 having a luminescent portion 8 and a terminal electrode portion 9 provided. Subsequently, in order to cover all the laminated films 7, a first sealing film 5 is formed. On the first sealing film 5, a mask pattern 12 is formed by masking tape. On the mask pattern 12, a second sealing film 6 is formed and the mask pattern 12 is removed to obtain the second sealing film 6 having an opening 11 of a certain pattern. Subsequently, by dry-etching using as a mask the second sealing film 6 with the opening 11 of the certain pattern, the first sealing film 5 is patterned according to the pattern of the opening 11. If at this point the opening 11 corresponding to the terminal electrode portions 9 of the laminated films 7 are provided on the second sealing film 6, a plurality of organic EL devices 10 can be formed on the mother glass wherein each of the terminal electrode portions 9 is completely exposed and the other portions is completely covered by the first sealing film 5 and the second sealing film 6. Patterning accuracy upon dry-etching is very high. Thus, according to the present method, when a plurality of organic EL devices 10 are formed on one large substrate 1, it is not necessary to form the terminal electrode portions 9 larger taking into account accumulation of tolerance, errors, etc., in order to completely expose the terminal electrode portions 9. Accordingly, margins around each of the organic EL devices 10 can be decreased so as to allow even more organic EL devices 10 to be formed.

In conclusion, the present method advantageously allows the patterning of sealing films during the fabrication of organic EL devices having sealing films while circumventing the above defects of the conventional art.

Other advantages of the present invention will be more apparent to those skilled in the art after reading the following examples to illustrate applications without limitations.

The present inventors have indeed fabricated organic EL devices with a variety of good properties, as shown in the following examples.

Hereinafter, examples of the present invention will be described. However, the present invention naturally should not be construed as being limited to the following examples.

EXAMPLES

Example 1

Organic EL device 10 was fabricated as follows.

First, a glass substrate (substrate 1), on one of whose surfaces an ITO layer of 150 nm film thickness (a first electrode 2) had been formed as the anode, was prepared, washed with an alkali and then with pure water, dried, and then washed with UV-ozone.

Substrate 1 thus washed was placed in a vacuum vapor deposition apparatus to form laminated film 7 by sequential lamination of an organic layer 3 comprising a luminescent layer and a second electrode 4 on the first electrode 2. In this example (example 1), the organic layer 3 comprising a luminescent layer was composed of organic layers 3a, 3b, 3c, and 3d.

On the surface of the first electrode 2 formed on the substrate 1, using a carbon crucible at a vapor deposition speed of 0.1 nm/s in vacuo about $5.0 \times 10^{-5}$ Pa, organic layer 3a was formed of copper phthalocyanine of 10 nm film thickness as a hole-injecting layer.

On the hole-injecting layer, using a carbon crucible at a vapor deposition speed of 0.1 nm/s in vacuo about $5.0 \times 10^{-5}$ Pa, organic layer 3b of tetramers of triphenylamine of 50 nm film thickness was formed as a hole-transporting layer.

On the hole-transporting layer, using a carbon crucible at a vapor deposition speed of 0.1 nm/s in vacuo about $5.0 \times 10^{-5}$ Pa, organic layer 3c of DPVBi of 30 nm film thickness was formed as a luminescent layer.

On the luminescent layer, using a carbon crucible at a vapor deposition speed of 0.1 nm/s in vacuo about $5.0 \times 10^{-5}$ Pa, organic layer 3d of Alq3 of 30 nm film thickness was formed as an electron-transporting layer.

On the electron-transporting layer, using a carbon crucible at a vapor deposition speed of 0.03 nm/s in vacuo about $5.0 \times 10^{-5}$ Pa, an inorganic layer of lithium fluoride of 0.5 nm film thickness was formed as an electron-injecting layer.

On the electron-injecting layer, using a tungsten board at a vapor deposition speed of 1 nm/s in vacuo about $5.0 \times 10^{-5}$ Pa, an inorganic layer of aluminium of 150 nm film thickness (a second electrode 4) was formed as a cathode.

Further, upon thus forming laminated film 7, a terminal electrode portion 9 for connecting wires from an external electric source to supply direct voltage to the first electrode 2 and the second electrode 4 was formed by patterning with a metal mask.

As noted above, after laminated film 7 was formed by sequential lamination of the organic layer 3 comprising a luminescent layer and the second electrode 4 on the substrate 1 on which the first electrode 2 had been formed, silicon nitride film was formed as a first sealing film 5 which covers the whole region of the laminated film 7 using a plasma CVD apparatus. That is, the laminated film 7 was placed in the CVD chamber of the plasma CVD apparatus, which was evacuated down to a pressure of $1 \times 10^{-3}$ Pa. 100 mL of $SiH_4$, 50 mL of $NH_3$, and 1000 mL of $N_2$ were flowed into the chamber in order to adjust the pressure to 75 Pa. Then, to a gap of 20 mm between the pair of electrodes, a high frequency power of 13.56 MHz and 600 W was supplied to allow gas-discharge to deposite a silicon nitride film of 1 μm thickness.

After removal of organic EL device 10 from the CVD chamber wherein the first sealing film 5 had been provided, in order to cover only the portion corresponding to the terminal electrode 9 of organic EL device 10, masking tape was adhered onto the surface of the first sealing film 5 to form mask pattern 12. Then, using a spinner at 500 rpm, 20 weight % of polysilazane, NL-120 manufactured by Clariant Japan, was deposited over the surface of the first sealing film 5. Then, using a hot plate at 90° C., the polysilazane was dried for 30 minutes resulting in formation of silicon oxide of 0.5 μm film thickness.

Then, removal of the masking tape formed the second sealing film 6 having opening 11 provided corresponding to the terminal electrode 9. Then, the organic EL device 10 was placed in a chamber for dry-etching, into which $NF_3$ was introduced as an etching gas, and dry-etched to pattern the first sealing film 5. The etching conditions were a $NF_3$ flux of 450 sccm, a pressure inside the chamber of 80 Pa, and a highly frequent power of 800 W.

After dry-etching, the first sealing film 5 over the terminal electrode 9 was completely removed. Inversely, all the rest portions except for the terminal electrode 9 were completely covered with the first sealing film 5 and the second sealing film 6.

Finally, organic EL device 10 was obtained wherein only the terminal electrode 9 was completely exposed.

What is claimed is:

1. A method of fabricating an organic electroluminescent device comprising the steps of:
   (1) preparing a substrate on which a first electrode has been formed and forming a laminated film by laminating an organic layer comprising a luminescent layer and a second electrode on the first electrode in this order;
   (2) forming a first sealing film which covers a whole region of the laminated film;
   (3) forming on a surface of the first sealing film a second sealing film having an opening pattern, wherein the first sealing film and the second sealing film are formed of different film thicknesses; and
   (4) patterning the first sealing film by dry-etching the first sealing film using the second sealing having the opening pattern as a mask, wherein the first sealing film is patterned utilizing the difference between the film thicknesses of the first sealing film and the second sealing film.

2. A method of fabricating an organic electroluminescent device according to claim 1 wherein the first sealing film and the second sealing film are made of different materials and wherein the first sealing film is patterned utilizing an etching speed gap arising from the difference between the materials of the first sealing film and the second sealing film.

3. A method of fabricating an organic electroluminescent device according to claim 1 wherein in step (1) the laminated film includes a luminescent portion and a terminal electrode portion, in step (2) the first sealing film is formed over the whole region of the laminated film including the luminescent portion and the terminal electrode portion, in step (3) the second sealing film is formed in which a portion corresponding to the terminal electrode portion is an opening, and in step (4) the terminal electrode portion is exposed by removal of the first sealing film on the terminal electrode portion.

4. A method of fabricating an organic electroluminescent device according to claim 1 wherein in step (3) masking tape is adhered onto the surface of the first sealing film to form a mask pattern, the second sealing film is formed on the surface of the first sealing film on which the mask pattern has been formed, and the second sealing film having the opening pattern is formed by removal of the masking tape.

5. A method of fabricating an organic electroluminescent device according to claim 1 wherein the first sealing film is made of silicon nitride and the second sealing film is made of silicon oxide.

6. A method of fabricating an organic electroluminescent device according to claim 1 wherein the first sealing film comprises multiple layers.

7. A method of fabricating an organic electroluminescent device according to claim 1 wherein in step (4) the dry-etching uses $NF_3$ as an etching gas.

* * * * *

UNITED STATES PATENT AND TRADEMARK OFFICE
CERTIFICATE OF CORRECTION

| | | |
|---|---|---|
| PATENT NO. | : 7,470,610 B2 | Page 1 of 1 |
| APPLICATION NO. | : 11/517726 | |
| DATED | : December 30, 2008 | |
| INVENTOR(S) | : Kenji Nishigaki | |

It is certified that error appears in the above-identified patent and that said Letters Patent is hereby corrected as shown below:

Column 1, lines 24 and 31, please delete "JP 2000-113 981 A" and insert therefore -- JP 2000-113981 A --;

Column 3, lines 33-34, please delete "A Luminescent layer" and insert therefore -- A luminescent layer --;

Column 4, line 46, please delete "As the etching gase," and insert therefore -- As the etching gas, --;

Column 6, line 31, please delete "and the other portions is completely covered" and insert therefore -- and the other portions are completely covered --;

Column 7, lines 46-47, please delete "and 1000 mL of $N_2$ were flowed into the chamber" and insert therefore -- and 1000 mL of $N_2$ flowed into the chamber --; and Column 8, lines 6-7, please delete "Inversely, all the rest portions" and insert therefore -- Inversely, all the rest of the portions --.

In Claim 1, column 8, lines 26-27, please delete "using the second sealing having the opening pattern as a mask," and insert therefore -- using the second sealing film having the opening pattern as a mask, --.

Signed and Sealed this

Sixth Day of October, 2009

David J. Kappos
*Director of the United States Patent and Trademark Office*